United States Patent
Kimball et al.

(10) Patent No.: US 10,804,129 B2
(45) Date of Patent: *Oct. 13, 2020

(54) ELECTROSTATIC CHUCK ASSEMBLY INCORPORATION A GASKET FOR DISTRIBUTING RF POWER TO A CERAMIC EMBEDDED ELECTRODE

(71) Applicant: Lam Research Corporation, Fremont, CA (US)

(72) Inventors: Christopher Kimball, San Jose, CA (US); Keith Gaff, Alameda, CA (US); Alexander Matyushkin, San Jose, CA (US); Zhigang Chen, Campbell, CA (US); Keith Comendant, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/988,581

(22) Filed: May 24, 2018

(65) Prior Publication Data

US 2018/0277412 A1 Sep. 27, 2018

Related U.S. Application Data

(63) Continuation of application No. 14/517,095, filed on Oct. 17, 2014, now Pat. No. 10,002,782.

(51) Int. Cl.
*H01L 21/683* (2006.01)
*H01L 21/02* (2006.01)
(Continued)

(52) U.S. Cl.
CPC .... *H01L 21/6833* (2013.01); *H01J 37/32568* (2013.01); *H01J 37/32715* (2013.01); *H01J 37/32724* (2013.01)

(58) Field of Classification Search
None
See application file for complete search history.

(56) References Cited

U.S. PATENT DOCUMENTS 5,463,526 A 10/1995 Mundt
5,793,192 A 8/1998 Kubly et al.
(Continued)

OTHER PUBLICATIONS

"bonding, n.". OED Online. Sep. 2016. Oxford University Press. http://www.oed.com/viewdictionaryentry/Entry/21279 (accessed Sep. 17, 2016).

*Primary Examiner* — Karla A Moore
*Assistant Examiner* — Tiffany Z Nuckols

(57) ABSTRACT

An electrostatic chuck assembly for processing a semiconductor substrate is provided. The electrostatic chuck assembly includes a first layer, a baseplate, a second layer, and at least one annular gasket. The first layer includes ceramic material and a first radio frequency (RF) electrode. The first RF electrode is embedded in the ceramic material. The second layer is disposed between the first layer and the baseplate. The at least one annular gasket extends along an upper surface of the baseplate and through the second layer. The at least one annular gasket electrically couples the upper surface of the baseplate to the first RF electrode. RF power passes from the baseplate to the first RF electrode through the at least one annular gasket.

24 Claims, 5 Drawing Sheets

(51) Int. Cl.
  *H01L 21/3065* (2006.01)
  *H01L 21/285* (2006.01)
  *H01L 21/67* (2006.01)
  *H01J 37/32* (2006.01)

(56) References Cited

U.S. PATENT DOCUMENTS

| | | | |
|---|---|---|---|
| 5,880,920 A | 3/1999 | Fischer et al. | |
| 5,880,924 A | 3/1999 | Kumar et al. | |
| 5,923,521 A | 7/1999 | Burkhart | |
| 5,933,314 A | 8/1999 | Lambson et al. | |
| 6,178,919 B1 | 1/2001 | Li et al. | |
| 6,238,160 B1 | 5/2001 | Hwang et al. | |
| 6,273,958 B2 | 8/2001 | Shamouilian et al. | |
| 6,303,879 B1 | 10/2001 | Burkhart | |
| 6,310,755 B1 | 10/2001 | Kholodenko et al. | |
| 6,483,690 B1 | 11/2002 | Nakajima et al. | |
| 6,512,333 B2 | 1/2003 | Chen | |
| 6,567,258 B2 | 5/2003 | Sexton et al. | |
| 6,639,783 B1 | 10/2003 | Shamouilian et al. | |
| 6,645,304 B2 | 11/2003 | Yamaguchi | |
| 6,646,233 B2 | 11/2003 | Kanno et al. | |
| 6,649,021 B2 | 11/2003 | Ohmoto et al. | |
| 6,665,168 B2 | 12/2003 | Lin | |
| 6,670,038 B2 | 12/2003 | Sun et al. | |
| 6,678,143 B2 | 1/2004 | Masuda et al. | |
| 6,760,213 B2 | 7/2004 | Yamamoto | |
| 6,848,690 B1 | 2/2005 | Hunter | |
| 6,951,587 B1 | 10/2005 | Narushima | |
| 6,972,071 B1 | 12/2005 | Tyler | |
| 7,072,166 B2 | 7/2006 | Qin et al. | |
| 7,149,070 B2 | 12/2006 | Breitschwerdt et al. | |
| 7,196,896 B2 | 3/2007 | Howald et al. | |
| 7,209,339 B2 | 4/2007 | Kitabayashi et al. | |
| 7,218,503 B2 | 5/2007 | Howald | |
| 7,274,004 B2 | 9/2007 | Benjamin et al. | |
| 7,791,857 B2 | 9/2010 | Mizuno et al. | |
| 7,821,767 B2 | 10/2010 | Fujii | |
| 7,848,077 B2 | 12/2010 | Mizuno et al. | |
| 7,869,184 B2 | 1/2011 | Steger | |
| 7,892,445 B1 | 2/2011 | Wei et al. | |
| 8,060,330 B2 | 11/2011 | O'Neill et al. | |
| 8,098,475 B2 | 1/2012 | Sijben | |
| 8,139,340 B2 | 3/2012 | Reynolds | |
| 8,199,454 B2 | 6/2012 | Koyama et al. | |
| 8,270,142 B2 | 9/2012 | Lee et al. | |
| 8,390,980 B2 | 3/2013 | Sansoni et al. | |
| 8,422,193 B2 | 4/2013 | Tao et al. | |
| 8,520,360 B2 | 8/2013 | Singh | |
| 8,536,494 B2 | 9/2013 | Benjamin et al. | |
| 8,546,732 B2 | 10/2013 | Singh | |
| 8,559,159 B2 | 10/2013 | Roy et al. | |
| 2003/0196760 A1* | 10/2003 | Tyler | H01J 37/32082 156/345.47 |
| 2004/0168640 A1* | 9/2004 | Muto | C23C 4/02 118/728 |
| 2004/0244688 A1 | 12/2004 | Himori et al. | |
| 2005/0042881 A1 | 2/2005 | Nishimoto et al. | |
| 2007/0109714 A1 | 5/2007 | Chung | |
| 2007/0204958 A1* | 9/2007 | Lee | C23C 16/5096 156/345.31 |
| 2008/0017111 A1 | 1/2008 | Ishisaka et al. | |
| 2008/0197780 A1* | 8/2008 | Yamazawa | H01J 37/32091 315/111.21 |
| 2009/0290145 A1 | 11/2009 | Howard et al. | |
| 2011/0149462 A1 | 6/2011 | Kugimoto et al. | |
| 2013/0088808 A1 | 4/2013 | Parkhe et al. | |
| 2013/0088809 A1 | 4/2013 | Parkhe et al. | |
| 2013/0100572 A1 | 4/2013 | Shu | |
| 2013/0128409 A1 | 5/2013 | Nam et al. | |
| 2013/0153147 A1 | 6/2013 | Senzaki et al. | |
| 2013/0279066 A1* | 10/2013 | Lubomirsky | H01L 21/67103 361/234 |
| 2013/0284709 A1 | 10/2013 | Makhratchev et al. | |
| 2013/0286531 A1 | 10/2013 | Shiraiwa et al. | |
| 2013/0286533 A1 | 10/2013 | Takasaki et al. | |
| 2013/0321974 A1 | 12/2013 | Kuribayashi | |
| 2013/0340942 A1 | 12/2013 | Schaefer et al. | |
| 2014/0063681 A1 | 3/2014 | Anada et al. | |
| 2014/0069585 A1 | 3/2014 | Aoto et al. | |
| 2014/0071582 A1 | 3/2014 | Anada et al. | |
| 2014/0116622 A1 | 5/2014 | Lee | |
| 2014/0159325 A1* | 6/2014 | Parkhe | H01L 21/67109 279/128 |
| 2014/0204501 A1 | 7/2014 | Moriya et al. | |

* cited by examiner

ELECTROSTATIC CHUCK ASSEMBLY INCORPORATION A GASKET FOR DISTRIBUTING RF POWER TO A CERAMIC EMBEDDED ELECTRODE

CROSS-REFERENCE TO RELATED APPLICATIONS

The present disclosure is a continuation of U.S. patent application Ser. No. 14/517,095 filed on Oct. 17, 2014. The entire disclosure of the application referenced above is incorporated herein by reference.

FIELD OF THE INVENTION

The invention relates to improvements in electrostatic chuck assembly designs and methods of uniformly supplying RF energy to a RF electrode of an electrostatic chuck assembly.

BACKGROUND

Various chucking arrangements have been developed for clamping substrates during processing thereof in vacuum chambers such as plasma etch chambers, plasma enhanced physical vapor deposition chambers, chemical vapor deposition chambers, plasma enhanced chemical vapor deposition chambers, and atomic layer deposition chambers. One challenge has been uniformly delivering RF power to an electrode embedded within a layer of ceramic material of the electrostatic chuck. Thus, there is a need for improved electrostatic chuck designs and methods of supplying RF power to a RF electrode embedded within the electrostatic chuck.

SUMMARY

Disclosed herein is a substrate processing apparatus for processing substrates. The substrate processing apparatus comprises a processing chamber in which a semiconductor substrate is processed, a process gas source which is in fluid communication with the processing chamber and is adapted to supply process gas into the processing chamber, and a RF energy source adapted to energize the process gas into a plasma state in the processing chamber. A vacuum source is adapted to exhaust process gas and byproducts of the processing from the processing chamber. The processing chamber includes an electrostatic chuck assembly comprising a layer of ceramic material including an upper electrostatic clamping (ESC) electrode and at least one RF electrode. The electrostatic chuck assembly also includes a temperature controlled RF powered baseplate, and at least one annular electrically conductive gasket extending along an upper surface of the temperature controlled RF powered baseplate. The at least one annular electrically conductive gasket extends through or around a bond layer, which bonds the temperature controlled RF powered baseplate to the layer of ceramic material, and electrically couples the upper surface of the temperature controlled RF powered baseplate to the at least one RF electrode. The layer of ceramic material includes a support surface adapted to electrostatically clamp a substrate during substrate processing.

Further disclosed herein is a method of making an electrostatic chuck assembly. The method comprises making a layer of ceramic material having an upper electrostatic clamping (ESC) electrode and at least one RF electrode embedded therein by arranging layers of green ceramic material with the upper ESC electrode and the at least one RF electrode therebetween and firing the layers of the green ceramic material to form the layer of ceramic material. The layer of ceramic material is bonded to an upper surface of a temperature controlled RF powered baseplate wherein at least one annular electrically conductive gasket electrically extends through the bond layer and electrically couples the RF powered baseplate to the at least one RF electrode.

BRIEF DESCRIPTION OF THE DRAWING FIGURES

DETAILED DESCRIPTION

Figure 1:
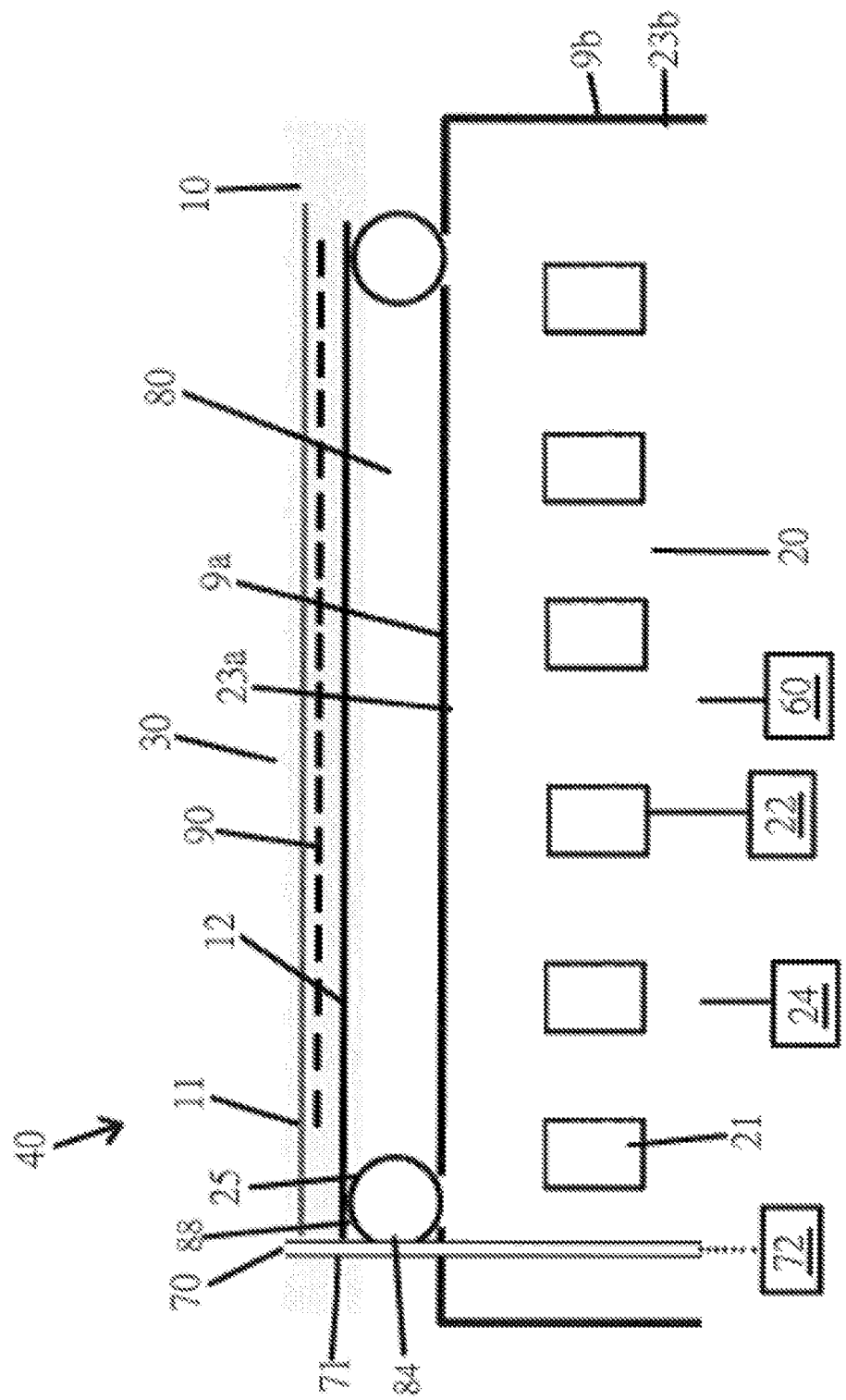
FIG. 1 is a schematic of an ESC assembly according to embodiments disclosed herein.

Disclosed herein are embodiments of an electrostatic chuck (ESC) assembly of a semiconductor substrate (substrate) processing apparatus wherein RF power is uniformly delivered from a temperature controlled RF powered baseplate to at least one RF electrode through at least one annular electrically conductive gasket. The semiconductor substrate processing apparatus preferably includes a semiconductor substrate processing chamber (i.e. vacuum chamber) in which a semiconductor substrate is processed, a process gas source in fluid communication with the processing chamber adapted to supply process gas into the processing chamber, and a vacuum source adapted to exhaust process gas and byproducts of the processing from the processing chamber. The processing apparatus is preferably a plasma processing apparatus which further includes a RF energy source adapted to energize the process gas supplied into the processing chamber into a plasma state in the processing chamber. The semiconductor substrate processing apparatus also preferably includes a control system configured to control processes performed by the processing apparatus and a non-transitory computer machine-readable medium comprising program instructions for control of the processing apparatus. The processing chamber may be a plasma etching, a chemical vapor deposition chamber, a plasma enhanced chemical vapor deposition chamber, an atomic layer deposition chamber, a plasma enhanced atomic layer deposition apparatus, or the like (all of which are herein referred to as a vacuum chambers) of the semiconductor substrate processing apparatus. In the following description, numerous specific details are set forth in order to provide a thorough understanding of the present embodiments. It will be apparent, however, to one skilled in the art that the present embodiments may be practiced without some or all of these specific details. In other instances, well known process operations have not been described in detail in order not to unnecessarily obscure present embodiments disclosed herein. Additionally, as used herein, the term "about" when used with reference to numerical values refers to ±10%.

Electrostatic chuck assemblies (as used herein "ESC assemblies") are commonly used to clamp a substrate (e.g. Johnsen Rahbek effect or Coulombic effect) and provide thermal control of the substrate (i.e. semiconductor substrate) during semiconductor fabrication processes. ESC assemblies provide a clamping force to hold the substrate on a support surface thereof when voltage (DC or AC) is applied to one or more electrostatic clamping (ESC) electrodes in the ESC assembly wherein the ESC electrode can be a monopolar or bipolar ESC electrode. Upon the removal of the applied voltage, the substrate can be removed from the support surface. The ESC assembly preferably includes lift pins which are operable to lower a substrate onto the support surface of the ESC assembly before the substrate is processed, and raise the substrate from the support surface of the ESC assembly after the substrate has been processed. An exemplary embodiment of an ESC assembly including lift pins which are operable to lower and raise a substrate can be found in commonly-assigned U.S. Pat. No. 6,567,258 which is incorporated by reference herein in its entirety.

While the substrate is clamped on the support surface of the ESC assembly, small spaces/gaps between the substrate and the ESC support surface are preferably filled with helium (usually at pressures between 1-100 Torr) to provide an improved heat transfer coefficient relative to just physical contact between the substrate and the ESC.

FIG. 1 shows an electrostatic chuck (ESC) assembly 40 which is coupled to a control system 24 which is operable to control processes performed by the ESC assembly 40 such as raising and lowering lift pins (not shown) included therein and temperature control of a semiconductor substrate supported on a support surface (e.g. mesa pattern) 30 of a layer of ceramic material 10 of the ESC assembly 40. At least one outlet (i.e. gas opening) 70 in the support surface 30 can deliver a heat transfer gas to an underside of a semiconductor substrate supported on the support surface 30. At least one gas passage 71 in the layer of ceramic material 10 is connected to a source of heat transfer gas 72 which is operable to supply heat transfer gas at a desired pressure to the at least one gas passage 71 such that the heat transfer gas can be delivered to the backside of a substrate supported on the support surface 30 of the layer of ceramic material 10 through the at least one outlet 70.

The layer of ceramic material 10 can include an ESC electrode 11 operable to clamp a semiconductor substrate on the support surface 30 thereof and at least one RF electrode 12 below the ESC electrode 11. Preferably, the ESC electrode 11 and the at least one RF electrode 12 are planar or substantially planar wherein the ESC electrode 11 and the at least one RF electrode 12 are parallel to an upper plane of the support surface 30. An exemplary embodiment of an ESC assembly including an ESC electrode and at least one RF electrode below the ESC electrode 11 can be found in commonly-assigned U.S. Pat. No. 6,483,690 which is incorporated by reference herein in its entirety.

The upper ESC electrode 11 can include a pattern of an electrically conductive material and can be a bipolar or monopolar ESC electrode. In an embodiment, the support surface 30 can have a 0.5-10 mm outer annular edge seal at an outer periphery thereof such that a clamped substrate is able to sustain up to about a 100 Torr pressure difference between the substrate backside and the pressure in the vacuum chamber of the semiconductor substrate processing apparatus. In an embodiment, the outer annular edge seal of the support surface 30 may be less than about 0.5 mm. Thus, the pressure of the heat transfer gas supplied to the backside of the substrate can be maintained, thereby enhancing thermal conductivity between the ESC assembly 40 and a substrate. Additionally, the support surface 30 can include a mesa pattern including a plurality of mesas such that the contact area between the substrate and the support surface 30 can be reduced.

The temperature controlled RF powered baseplate 20 can include fluid passages 21 therein such that temperature of the RF powered baseplate 20 can be controlled by connecting the RF powered baseplate 20 to a temperature control unit 22 that circulates temperature controlled fluid through the fluid passages 21. The temperature control unit 22 can also control the temperature of the temperature controlled fluid circulated through the fluid passages 21 to uniformly control temperature across the RF powered baseplate 20, or the fluid passages 21 can be arranged in a plurality of zones for independent control of temperature in each zone.

The layer of ceramic material 10 of the ESC assembly 40 is bonded onto the temperature controlled RF powered baseplate 20 by a bond layer 80. The bond layer 80 is preferably an elastomeric material. The elastomeric bond material forming the bond layer 80 can be applied to the RF powered baseplate 20 in liquid form and cured in-situ to form the bond layer 80 between the layer of ceramic material 10 and the RF powered baseplate 20, or alternatively, the elastomer bond material forming the bond layer 80 can be a pre-cured or partially cured sheet of material. The thermal resistance of the bond layer 80 between the layer of ceramic material 10 and the RF powered baseplate 20 can be selected such that temperature difference between the layer of ceramic material 10 and the RF powered baseplate 20 can be between 2° C. and 150° C. at about 10 W/cm$^2$ heat flux into a substrate supported on the support surface 30. Additionally, independently controlled heaters 90 can be embedded in the layer of ceramic material 10 to form independently controllable heater zones to independently control and tune the spatial and temporal temperature of the support surface 30 of ESC assembly 40 as well as the spatial and temporal temperature of a semiconductor substrate supported on the support surface 30.

The temperature controlled RF powered baseplate 20 can be electrically coupled to an RF energy source 60 operable to supply RF power to the RF powered baseplate 20. The RF energy is transferred from the RF powered baseplate 20 to the at least one RF electrode 12 included in the layer of ceramic material 10 wherein each RF electrode 12 is preferably formed by a pattern of electrically conductive material. The RF electrode 12 can be disc-shaped or annularly shaped.

In ESC assemblies wherein RF power is capacitively coupled between an RF powered baseplate and an RF electrode included in the layer of ceramic material, an RF voltage difference exists between the RF powered baseplate and the RF electrode. The RF voltage difference between the RF powered baseplate and the RF electrode can increase an RF voltage difference between a substrate supported on the layer of ceramic material and the RF powered baseplate wherein the RF voltage difference between the substrate and the RF powered baseplate can cause arcing to occur therebetween thereby damaging the ESC assembly. Providing a direct electrical connection between the RF powered baseplate and the RF electrode will cause the RF powered baseplate and the RF electrode to be at about the same voltage, which can reduce the likelihood of arcing between a substrate supported on the layer of ceramic material and the RF powered baseplate. However, in ESC assemblies wherein the RF electrode is supplied RF power from the temperature controlled RF powered baseplate at a single point, or at a couple of small area electrical contact points, non-uniform RF power can be supplied to the RF electrode, which thereby forms non-uniform plasma above an upper surface of a semiconductor substrate. Further, when discrete electrical connections are formed between the RF electrode and the RF powered baseplate, non-uniform heating can occur at the points of electrical connection which can reduce uniformity during substrate processing. Additionally the discrete electrical connections can cause heating at the respective connections to temperatures above allowable tolerances which can damage an ESC assembly.

Therefore, RF power can be uniformly delivered from the temperature controlled RF powered baseplate 20 to at least one RF electrode 12 by at least one annular electrically conductive gasket 25 that extends through the bond layer 80 and electrically couples an upper surface 23a of the temperature controlled RF powered baseplate 20 to the RF electrode 12 which is embedded in the layer of ceramic material 10 of the ESC assembly 40. As used herein, "annular" refers to a continuous or discontinuous ring. The at least one annular electrically conductive gasket 25 is preferably a continuous ring and extending along an outer portion of the upper surface 23a of the RF powered baseplate 20 near the outer circumference of the RF powered baseplate 20 so as to uniformly deliver RF power from the RF powered baseplate 20 to the at least one RF electrode 12 such that azimuthal non-uniformity of RF power can be reduced. In an embodiment, the at least one annular electrically conductive gasket 25 can be a spiral gasket which is ring shaped. In embodiments, the at least one annular electrically conductive gasket 25 can have a hollow body or alternatively a solid body. In an embodiment, the at least one annular electrically conductive gasket 25 can be segmented. If the at least one annular electrically conductive gasket 25 is segmented, then preferably portions of the at least one annular electrically conductive gasket 25 are removed such that removed portions 84 of the annular electrically conductive gasket 25 are arranged so as to be symmetrically spaced along the annular electrically conductive gasket 25 such that RF power is delivered uniformly from the RF powered baseplate 20 to the RF electrode 12, and further so that the annular electrically conductive gasket 25 will not cause non-uniform heating (i.e. nonsymmetrical heating) along the circumference thereof. Further, if the at least one annular electrically conductive gasket 25 includes the removed portions 84 (i.e. is segmented), preferably less than about 90% of the volume of the annular electrically conductive gasket 25 is removed such that the volume of the remaining annular electrically conductive gasket 25 is great enough to avoid being heated above an allowable tolerance while the annular electrically conductive gasket 25 uniformly delivers RF power from the RF powered baseplate 20 to the RF electrode 12. The removed portions 84 can be removed from the annular electrically conductive gasket 25 to provide room for other features included in the ESC assembly 40. For example, portions of the annular electrically conductive gasket 25 can be removed so as not to obstruct a gas passage of the at least one gas passage 71.

A lower surface of the layer of ceramic material 10 preferably includes at least one circumferentially extending channel 88 therein wherein an upper portion of each of the at least one annular electrically conductive gaskets 25 is disposed in a respective channel 88 of the at least one channel 88. In an alternate embodiment (see FIG. 5), the lower surface of the layer of ceramic material 10 can include an outer peripheral step 118 extending around an outer periphery of the lower surface of the layer of ceramic material 10 wherein an upper portion of an annular electrically conductive gasket 25 is disposed in the outer peripheral step 118.

Preferably, the temperature controlled RF powered baseplate 20 includes an upper layer of dielectric insulating material 9a on the upper surface 23a thereof which is adapted to reduce arcing between the semiconductor substrate supported on the support surface 30 of the layer of ceramic material 10 and the RF powered baseplate 20. The RF powered baseplate 20 can also include an outer layer of dielectric insulating material 9b on an outer surface 23b which is adapted to reduce arcing between the semiconductor substrate supported on the support surface 30 of the layer of ceramic material 10 and the RF powered baseplate 20. The dielectric insulating material 9a, 9b can be formed by anodizing the upper surface 23a and/or the outer surface 23b of the RF powered baseplate 20 or by spraying a coating of dielectric insulating material on the on the upper surface 23a and/or the outer surface 23b of the RF powered baseplate 20. For example, a thermal spray coating of $Al_2O_3$ can be sprayed on the upper surface 23a and/or outer surface 23b. Preferably regions of the upper surface 23a of the RF powered baseplate 20 which contact the annular electrically conductive gasket 25 do not include the dielectric insulating material 9a.

Figure 2:
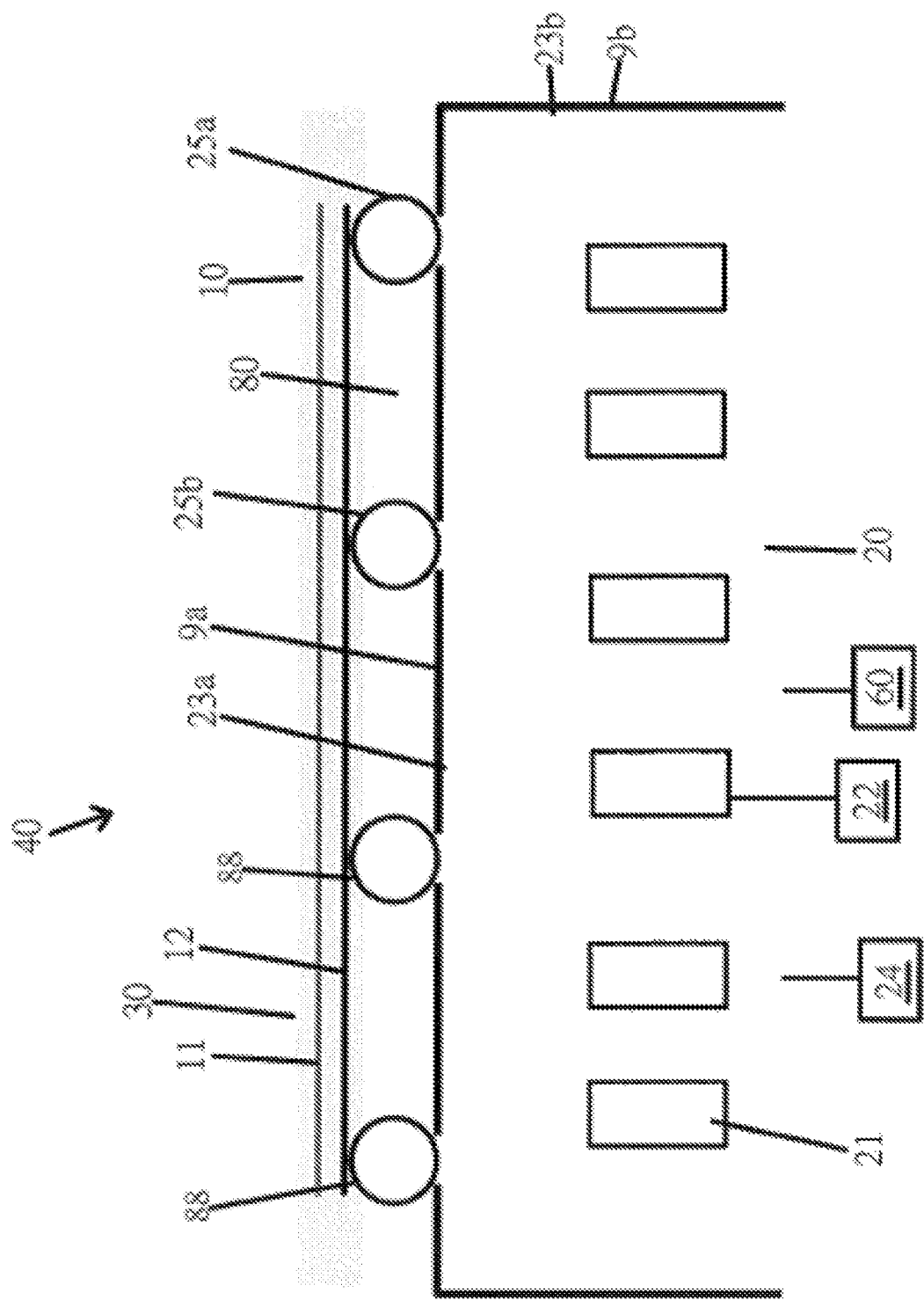
FIG. 2 is a schematic of an ESC assembly according to embodiments disclosed herein.
Figure 3:
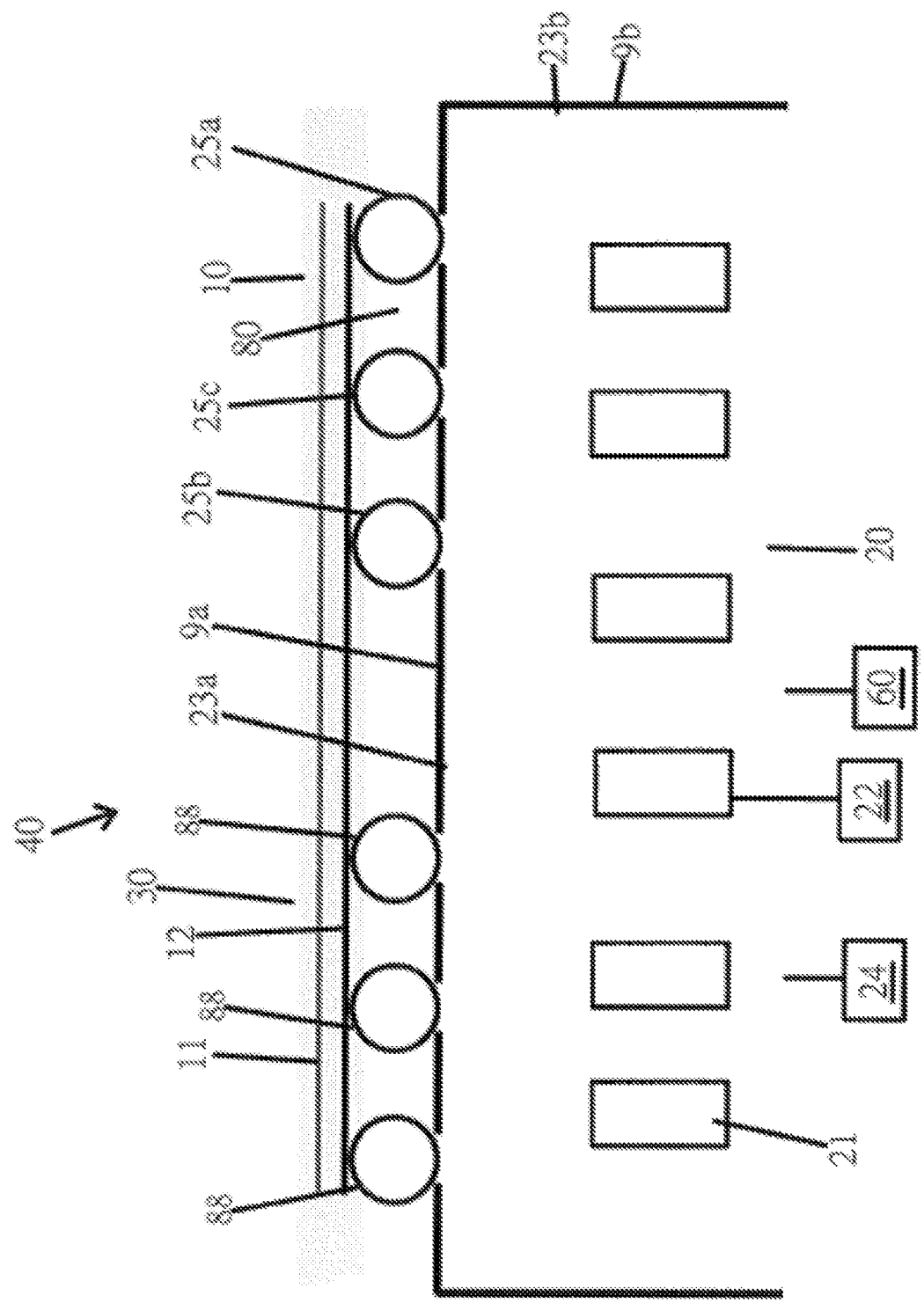
FIG. 3 is a schematic of an ESC assembly according to embodiments disclosed herein.

In an embodiment, as illustrated in FIG. 2, the at least one annular electrically conductive gasket 25 can include an outer annular electrically conductive gasket 25a and an inner annular electrically conductive gasket 25b disposed radially inward of the outer annular electrically conductive gasket 25a wherein the outer and inner annular electrically conductive gaskets 25a, 25b electrically couple the upper surface 23a of the temperature controlled RF powered baseplate 20 to the RF electrode 12. In a further embodiment, one or more intermediate annular electrically conductive gaskets can be disposed between the outer annular electrically conductive gasket 25a and the inner annular electrically conductive gasket 25b. For example, as illustrate in FIG. 3, an intermediate annular electrically conductive gasket 25c can be disposed between the outer annular electrically conductive gasket 25a and the inner annular electrically conductive gasket 25b wherein the outer, inner, and intermediate annular electrically conductive gaskets 25a, 25b, 25c electrically couple the upper surface 23a of the temperature controlled RF powered baseplate 20 to the RF electrode 12. By using multiple annular electrically conductive gaskets RF power can be uniformly delivered from the RF powered baseplate 20 to the RF electrode 12. Further, non-uniform heating of the ESC assembly 40 can be reduced by using more than one annular electrically conductive gasket.

Figure 4:
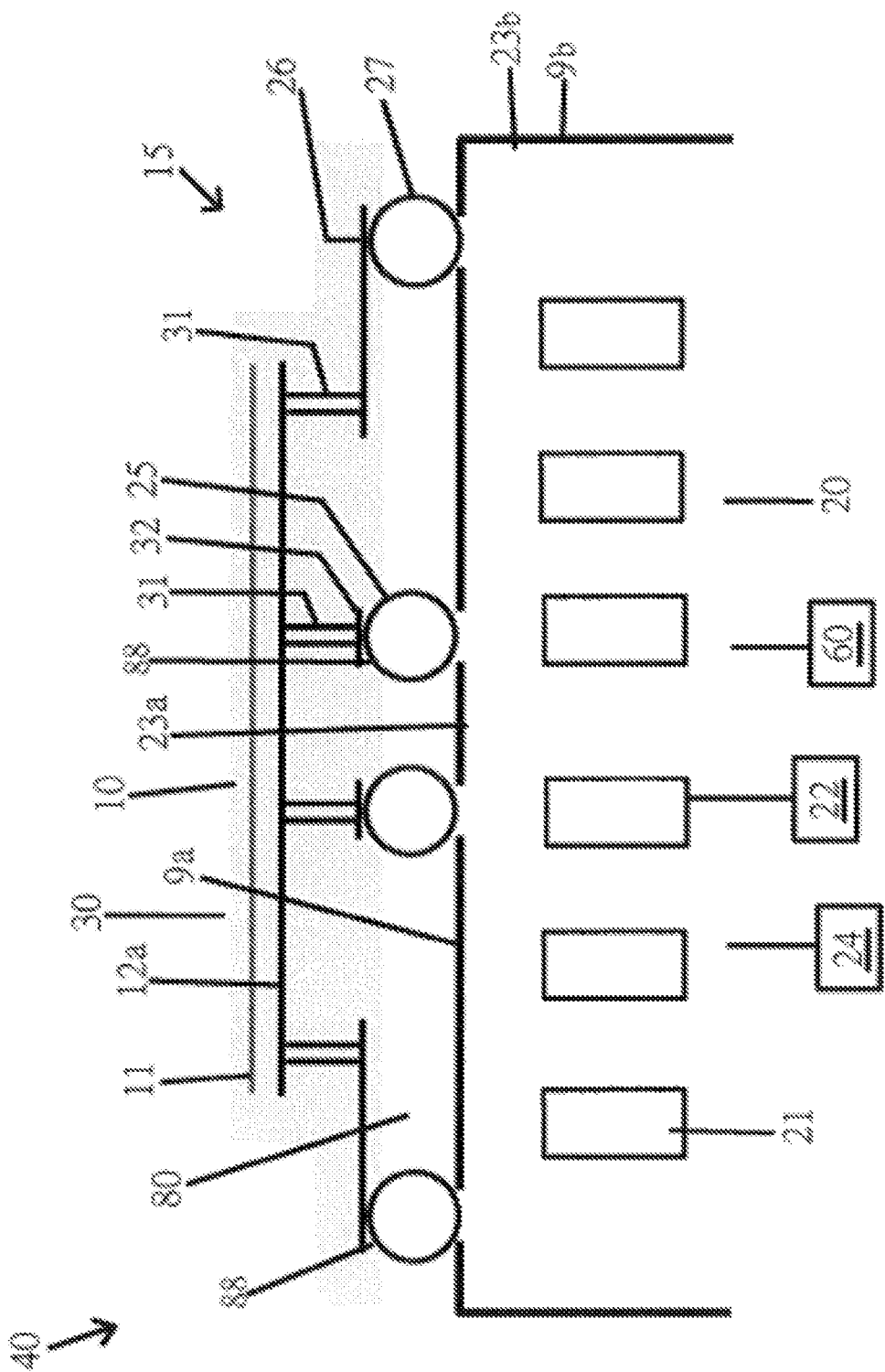
FIG. 4 is a schematic of an ESC assembly according to embodiments disclosed herein.

In an embodiment, as illustrated in FIG. 4, the layer of ceramic material 10 of the ESC assembly 40 can include a lower step 15 around an outer periphery of the upper surface thereof. Preferably, the at least one RF electrode 12 comprises an inner RF electrode 12a below the ESC electrode 11 and an outer annular RF electrode 26 underlying the lower step 15. The inner RF electrode 12a can be electrically coupled to the upper surface 23 of the RF powered baseplate 20 through a first annular electrically conductive gasket 25. The outer annular RF electrode 26 can be electrically coupled to the upper surface 23a of the RF powered baseplate 20 through a second outer annular electrically conductive gasket 27. In an embodiment, a plurality of vertical electrically conductive vias 31 electrically couple the outer annular RF electrode 26 to the inner RF electrode 12a. In a further embodiment, a plurality of vertical electrically conductive vias can electrically connect the outer annular RF electrode 26 to the outer annular electrically conductive gasket 27 wherein an optional annular electrical contact can be formed between the vertical electrically conductive vias and the outer annular RF electrode 26. Additionally, portions of the outer annular electrically conductive gasket 27 can be removed (e.g. to form a segmented outer annular electrically conductive gasket 27) so as not to obstruct other features included in the ESC assembly 40 such as a gas passage.

In an embodiment, a plurality of vertical electrically conductive vias 31, formed as vertical lines of electrically conductive material, included in the layer of ceramic material 10 can electrically connect the at least one RF electrode 12 to the at least one annular electrically conductive gasket 25. Preferably at least 100 vertical electrically conductive vias electrically connect the RF electrode 12 to the annular electrically conductive gasket. More preferably, at least 100, at least 200, at least 500, or at least 1000 vertical electrically conductive vias 31 electrically connect each annular electrically conductive gasket 25 to the at least one RF electrode 12. For example, in an embodiment, up to about 1000 or more vertical electrically conductive vias 31 arranged in an annular formation can electrically connect each annular electrically conductive gasket to the RF electrode. By using more than 100, and preferably more than 200, vertical electrically conductive vias 31, the heating problems associated with discrete electrical connections having a small area can be reduced or avoided. The plurality of vertical electrically conductive vias 31 are annularly arranged so as to correspond to the underlying shape of the annular electrically conductive gasket 25 disposed therebelow. In an embodiment, the layer of ceramic material 10 can include an annular electrical contact 32 disposed below the plurality of vertical electrically conductive vias 31 wherein the vertical electrically conductive vias 31 electrically connect the RF electrode 25 to the annular electrical contact 32 and wherein the annular electrical contact 32 is in electrical communication with the annular electrically conductive gasket 25. Preferably the annular electrical contact 32 is shaped so as to correspond to the shape of the annular electrically conductive gasket 25. The annular electrical contact 32 can form a flat surface which provides a better electrical connection between the plurality of vertical electrically conductive vias 31 and the annular electrically conductive gasket 25.

A lower surface of the layer of ceramic material 10 preferably includes at least one channel 88 therein wherein upper portions of respective ones of the at least one electrically conductive gaskets 25 are disposed in respective channels 88. Preferably, each channel 88 is arranged such that a lower surface of the at least one RF electrode 12, lower surfaces of the plurality of vertical electrically conductive vias 31, or lower surfaces of the annular electrical contacts 32 are exposed therein such that a respective electrical connection can be formed with the at least one electrically conductive gasket 25.

In an embodiment, the at least one annular electrically conductive gasket 25 can be a band of electrically conductive material which has a circular cross section (see FIG. 4) or a rectangular cross section. In an embodiment, the at least one electrically conductive gasket 25 can be separately formed and then installed in the ESC assembly 40 during construction of the ESC assembly 40. In this embodiment, the at least one electrically conductive gasket 25 can be, for example, an electrically conductive spiral gasket or an electrically conductive O-ring which is disposed between the layer of ceramic material 10 and the RF powered baseplate 20 and electrically couples the upper surface of the temperature controlled RF powered baseplate 20 to the at least one RF electrode 12 included in the layer of ceramic material 10. Alternatively, the at least one electrically conductive gasket 25 can be formed during construction of the ESC assembly 40 wherein the at least one RF gasket 25 can be an electrically conductive epoxy or an electrically conductive adhesive which is applied to a groove surrounding the bond layer 80 between the layer of ceramic material 10 and the RF powered baseplate 20. The electrically conductive epoxy or the electrically conductive adhesive is cured in-situ to form an electrically conductive gasket 25 (e.g., a band of electrically conductive material) wherein the electrically conductive gasket 25 couples the upper surface of the temperature controlled RF powered baseplate 20 to the at least one RF electrode 12 included in the layer of ceramic material 10.

Figure 5:
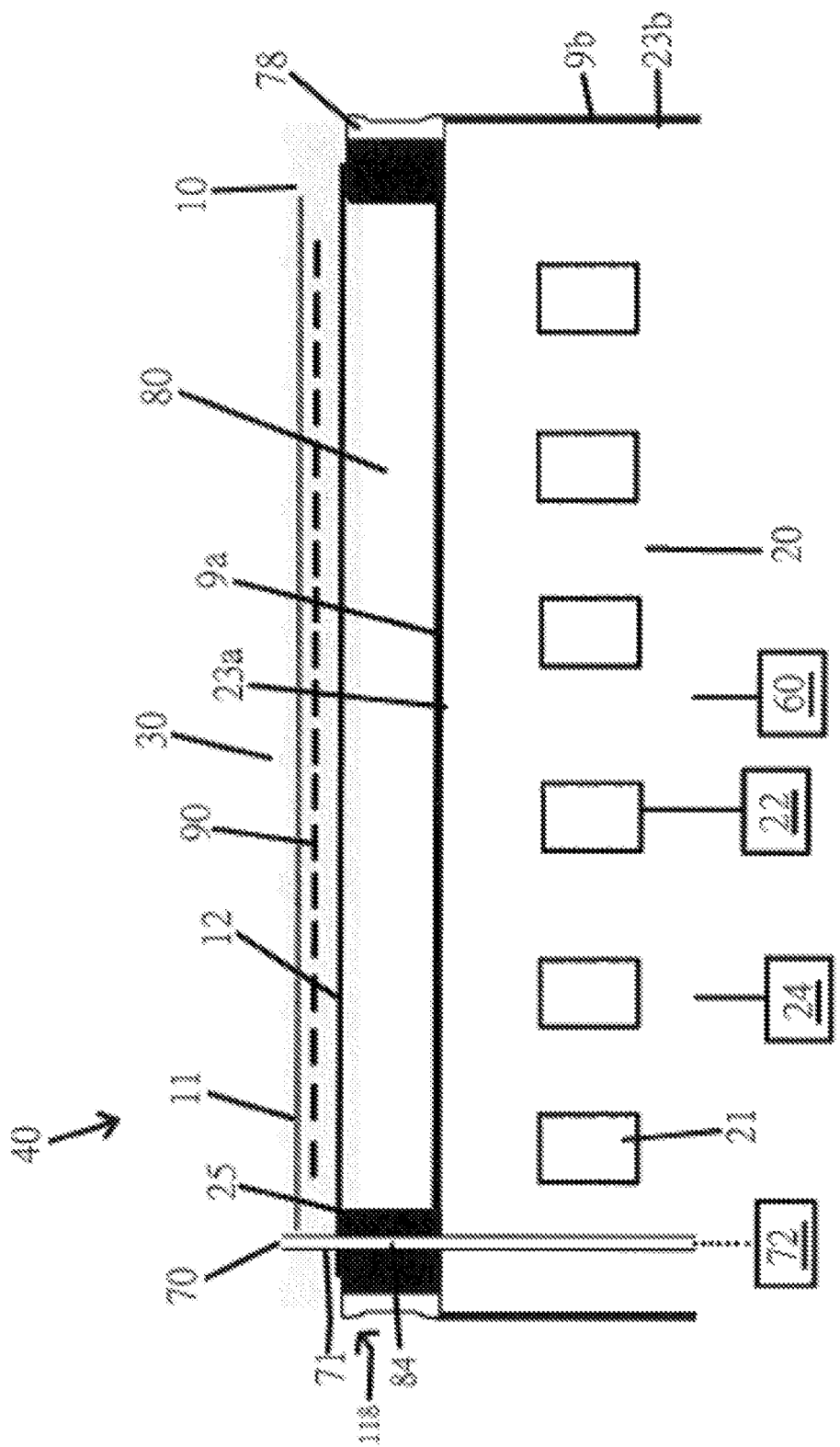
FIG. 5 is a schematic of an ESC assembly according to embodiments disclosed herein.

For example, as illustrated in FIG. 5, the band of electrically conductive material forming the annular electrically conductive gasket 25 has a rectangular cross section and extends around the bond layer 80 wherein an outer perimeter of the annular electrically conductive gasket 25 is radially located within about 10 mm of an outer perimeter of the layer of ceramic material 10 (i.e. the outer radius of the annular electrically conductive gasket 25 can be about 10 mm or less than the outer radius of the layer of ceramic material 10). In an embodiment, a protective O-ring 78, such as an elastomer O-ring or a Teflon (PTFE-PolyTetraFluoroEthylene, manufactured by DuPont) encapsulated elastomer O-ring, can surround the annular electrically conductive gasket 25 so as to protect the annular electrically conductive gasket 25 from plasma and/or reactive gases during semiconductor substrate processing. In an embodiment, the protective O-ring 78 can have a rectangular or nearly rectangular cross section wherein the protective O-ring 78 can include convex surfaces along the longest dimension of the rectangular or nearly rectangular cross section. An exemplary embodiment of a protective O-ring (i.e. an edge seal) can be found in commonly-assigned U.S. Patent Application No. 2013/0340942, which is hereby incorporated by reference herein in its entirety.

The band of electrically conductive material forming the annular electrically conductive gasket 25 can bond the RF powered baseplate 20 to the layer of ceramic material 10 and electrically couple the upper surface of the temperature controlled RF powered baseplate 20 to the RF electrode 12. In this embodiment, the material forming the annular electrically conductive gasket 25 can be an electrically conductive epoxy adhesive or an electrically conductive silicone adhesive which is cured in-situ in a groove between the RF powered baseplate 20 and the layer of ceramic material 10 surrounding the bond layer 80. In an embodiment, the electrically conductive epoxy adhesive or the electrically conductive silicone adhesive can include an electrically conductive filler such as, for example, a silver filler. In a further embodiment, a plurality of vertical electrically conductive vias (not shown) can electrically connect the RF electrode 12 to the band of electrically conductive material forming the annular electrically conductive gasket 25. In this embodiment, the outer peripheral step 118 can optionally be excluded from the lower surface of the layer of ceramic material 10.

To make the ESC assembly, according to embodiments disclosed herein, a layer of ceramic material having an upper electrostatic clamping (ESC) electrode and at least one RF electrode embedded therein is formed by arranging layers of green ceramic material with the upper ESC electrode and the at least one RF electrode therebetween. The layers of green ceramic material including the upper ESC electrode and the at least one RF electrode therebetween are fired to form the layer of ceramic material. The layer of ceramic material is bonded to an upper surface of a temperature controlled RF powered baseplate wherein at least one annular electrically conductive gasket electrically couples the RF powered baseplate to the RF electrode. In an embodiment, the upper ESC electrode and the at least one RF electrode can each be formed by screen printing a metal paste on a respective layer of the green ceramic material.

In an embodiment, holes can be punched in the arranged layers of the green ceramic material before firing. The holes can be filled with a metal paste to form a plurality of vertical electrically conductive vias adapted to electrically connect the at least one RF electrode to at least one annular electrically conductive gasket included between the RF powered base plate and the layer of ceramic material. Further, an annular electrical contact can be formed at the lower ends of the plurality of vertical electrically conductive vias wherein the vertical electrically conductive vias and the annular electrical contact are adapted to electrically connect the at least one RF electrode to the at least one annular electrically conductive gasket. In an embodiment an upper surface and/or an outer surface of the RF powered baseplate can be coated with a dielectric insulating material by anodizing the respective surfaces or thermal spray coating the respective surfaces with $Al_2O_3$ wherein regions of the upper surface of the RF powered baseplate adapted to electrically connect to the annular electrically conductive gasket are not coated.

During processing operations, such as plasma processing, process gas from a process gas source is supplied into a processing chamber (i.e. vacuum chamber) wherein the process gas is generated into plasma by supplying RF energy into the processing chamber such that the substrate may then be processed by a plasma etching or a plasma enhanced deposition process. A vacuum source evacuates the chamber of processing gas and process by-products. While processing the semiconductor substrate in the vacuum chamber, RF power is uniformly delivered from the RF powered baseplate to the RF electrode and/or an outer annular RF electrode through an annular electrically conductive gasket.

While the invention has been described in detail with reference to specific embodiments thereof, it will be apparent to those skilled in the art that various changes and modifications can be made, and equivalents employed, without departing from the scope of the appended claims.

What is claimed is:

1. An electrostatic chuck assembly for processing a semiconductor substrate, the electrostatic chuck assembly comprising:
    a first layer comprising ceramic material and a first radio frequency (RF) electrode, wherein the first RF electrode is embedded in the ceramic material;
    a baseplate;
    a second layer disposed between the first layer and the baseplate; and
    at least one annular gasket extending along an upper surface of the baseplate and through the second layer, wherein the at least one annular gasket electrically couples the upper surface of the baseplate to the first RF electrode, and wherein RF power is provided from the baseplate to the first RF electrode through the at least one annular gasket.

2. The electrostatic chuck assembly of claim 1, wherein the first layer comprises an electrostatic clamping electrode configured to electrostatically clamp the semiconductor substrate to a top surface of the first layer.

3. The electrostatic chuck assembly of claim 2, wherein the electrostatic clamping electrode is disposed above the first RF electrode.

4. The electrostatic chuck assembly of claim 2, wherein the electrostatic clamping electrode is embedded in the ceramic material.

5. The electrostatic chuck assembly of claim 1, wherein the second layer is a bond layer that bonds the first layer to the baseplate.

6. The electrostatic chuck assembly of claim 1, wherein:
    the at least one annular gasket comprises a first gasket and a second gasket; and
    the first gasket is disposed radially inward of the second gasket.

7. The electrostatic chuck assembly of claim 6, wherein:
    the first gasket and the second gasket are electrically conductive;
    the second gasket passes the RF power from the baseplate to the first RF electrode; and
    the first gasket passes other RF power from the baseplate to a second RF electrode.

8. The electrostatic chuck assembly of claim 1, wherein:
    the first layer includes a stepped portion; and
    the stepped portion extends along a circumference of the first layer.

9. The electrostatic chuck assembly of claim 8, further comprising a second RF electrode, wherein:
    the at least one annular gasket includes a first annular gasket and a second annular gasket;
    the first RF electrode is electrically coupled to the upper surface of the baseplate by the first annular gasket; and
    the second RF electrode is disposed underneath the stepped portion and is electrically coupled to the upper surface of the baseplate by the second annular gasket.

10. The electrostatic chuck assembly of claim 9, further comprising a first plurality of vias and a second plurality of vias, wherein:
    the first RF electrode is electrically coupled to the upper surface of the baseplate by the first plurality of vias; and
    the second plurality of vias electrically couple the second RF electrode to the first RF electrode.

11. The electrostatic chuck assembly of claim 9, wherein:
    the first annular gasket and the second annular gasket are electrically conductive;
    the first annular gasket passes other RF power from the baseplate to the first RF electrode; and
    the second annular gasket passes the RF power from the baseplate to the second RF electrode.

12. The electrostatic chuck assembly of claim 1, further comprising a plurality of vias embedded within the ceramic material,
    wherein the plurality of vias electrically couple the first RF electrode to the at least one annular gasket or to an annular electrical contact disposed in the ceramic material.

13. The electrostatic chuck assembly of claim 1, wherein the at least one annular gasket comprises a spiral gasket.

14. The electrostatic chuck assembly of claim 1, further comprising a third layer disposed between the second layer and the baseplate and comprising dielectric material,
    wherein the at least one annular gasket extends through the third layer and contacts the baseplate.

15. The electrostatic chuck assembly of claim 1, wherein the at least one annular gasket is disposed between and is in contact with the baseplate and the ceramic material.

16. The electrostatic chuck assembly of claim 1, further comprising an O-ring, wherein:

the at least one annular gasket has an outer radius that is less than an outer radius of the ceramic material; and the O-ring surrounds the at least one annular gasket.

17. The electrostatic chuck assembly of claim 1, wherein the at least one annular gasket comprises an electrically conductive epoxy adhesive or an electrically conductive silicone adhesive.

18. The electrostatic chuck assembly of claim 1, wherein the at least one annular gasket extends along an outer periphery of the second layer.

19. The electrostatic chuck assembly of claim 1, wherein the at least one annular gasket contacts the first RF electrode.

20. The electrostatic chuck assembly of claim 1, wherein:
the second layer comprises a non-conductive elastomeric material; and
the at least one annular gasket extends from the baseplate to the first RF electrode.

21. The electrostatic chuck assembly of claim 1, wherein the second layer provides thermal separation between the first layer and the baseplate, such that a temperature difference between the first layer and the baseplate is up to 150° C.

22. A processing system comprising:
the electrostatic chuck assembly of claim 1; and
a temperature controller,
wherein
the baseplate comprises a plurality of fluid passages,
the plurality of fluid passages are configured to receive a cooling fluid, and
the temperature controller is configured to control temperatures of the baseplate by controlling a temperature of the cooling fluid and circulation of the cooling fluid through the plurality of fluid passages.

23. A processing system comprising:
the electrostatic chuck assembly of claim 1;
a processing chamber, wherein the electrostatic chuck assembly is disposed in the processing chamber;
a gas source configured to supply a processing gas to an interior of the processing chamber; and
a RF energy source configured to supply RF energy to the baseplate to energize the process gas into a plasma state during processing of the semiconductor substrate.

24. The electrostatic chuck assembly of claim 1, wherein:
the at least one annular gasket comprises a first gasket and a second gasket;
the first gasket has an outer radius that is less than an outer radius of the ceramic material; and
the first gasket surrounds the second gasket.

* * * * *

UNITED STATES PATENT AND TRADEMARK OFFICE
CERTIFICATE OF CORRECTION

| | |
|---|---|
| PATENT NO. | : 10,804,129 B2 |
| APPLICATION NO. | : 15/988581 |
| DATED | : October 13, 2020 |
| INVENTOR(S) | : Christopher Kimball et al. |

It is certified that error appears in the above-identified patent and that said Letters Patent is hereby corrected as shown below:

On the Title Page

Column 1 in the title, Line 2, and in the Specification, Column 1, Line 2, delete "INCORPORATION" and insert --INCORPORATING-- therefor.

Signed and Sealed this
Eleventh Day of April, 2023

Katherine Kelly Vidal
*Director of the United States Patent and Trademark Office*